(12) United States Patent
Lim et al.

(10) Patent No.: US 7,377,049 B2
(45) Date of Patent: May 27, 2008

(54) ALIGNING APPARATUS

(75) Inventors: Jong-Go Lim, Daegu (KR); Jae-Gyu Jeong, Gyeongsangbuk-Do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/808,747

(22) Filed: Jun. 12, 2007

(65) Prior Publication Data

US 2007/0234585 A1    Oct. 11, 2007

Related U.S. Application Data

(62) Division of application No. 11/008,272, filed on Dec. 10, 2004, now Pat. No. 7,240,438.

(30) Foreign Application Priority Data

Dec. 10, 2003    (KR) .......................... 10-2003-89853

(51) Int. Cl.
*G02F 1/133* (2006.01)
*B23P 19/00* (2006.01)

(52) U.S. Cl. .......................... 33/645; 33/644; 269/903

(58) Field of Classification Search ............... 33/520, 33/558.01, 558.02, 613, 644, 645; 269/329, 269/903; 318/490; 324/758, 761; 388/935
See application file for complete search history.

(56) References Cited

U.S. PATENT DOCUMENTS

| | | | |
|---|---|---|---|
| 3,978,580 A | 9/1976 | Leupp et al. | |
| 4,094,058 A | 6/1978 | Yasutake et al. | |
| 4,189,230 A | 2/1980 | Zasio | |
| 4,425,076 A | 1/1984 | Colineau | |
| 4,467,250 A * | 8/1984 | Thomasson | 318/436 |
| 4,516,318 A | 5/1985 | Kirschenman | |
| 4,563,824 A | 1/1986 | Baun | |
| 4,653,864 A | 3/1987 | Baron et al. | |
| 4,691,995 A | 9/1987 | Yamazaki et al. | |
| 4,696,501 A * | 9/1987 | Webb | 294/86.4 |
| 4,775,225 A | 10/1988 | Tsuboyama et al. | |
| 4,860,439 A | 8/1989 | Riley | |
| 5,247,377 A | 9/1993 | Omeis et al. | |
| 5,263,888 A | 11/1993 | Ishihara et al. | |
| 5,379,139 A | 1/1995 | Sato et al. | |
| 5,406,989 A | 4/1995 | Abe | |
| 5,499,128 A | 3/1996 | Hasegawa et al. | |
| 5,507,323 A | 4/1996 | Abe | |
| 5,511,591 A | 4/1996 | Abe | |

(Continued)

FOREIGN PATENT DOCUMENTS

EP    1 003 066 A1    5/2000

(Continued)

*Primary Examiner*—R. A. Smith
(74) *Attorney, Agent, or Firm*—McKenna Long & Aldridge LLP

(57) ABSTRACT

An aligning apparatus includes a loading plate to load at least one alignment object; first and second alignment bars to align the at least one alignment object loaded on the loading plate, wherein the first and second alignment bars are bent by a force greater than a threshold value when contacting the alignment object; and at least one driving unit to drive the first and second alignment bars in close and open directions toward and away from each other.

6 Claims, 7 Drawing Sheets

U.S. PATENT DOCUMENTS

| | | |
|---|---|---|
| 5,539,545 A | 7/1996 | Shimizu |
| 5,548,429 A | 8/1996 | Tsujita |
| 5,642,214 A | 6/1997 | Ishii |
| 5,680,189 A | 10/1997 | Shiizu et al. |
| 5,707,052 A | 1/1998 | Adams et al. |
| 5,742,370 A | 4/1998 | Kim |
| 5,757,451 A | 5/1998 | Miyazaki |
| 5,852,484 A | 12/1998 | Inoue et al. |
| 5,854,664 A | 12/1998 | Inoue et al. |
| 5,861,932 A | 1/1999 | Inata |
| 5,875,922 A | 3/1999 | Chastine et al. |
| 5,952,676 A | 9/1999 | Sato |
| 5,956,112 A | 9/1999 | Fujimori |
| 5,974,654 A | 11/1999 | Morita |
| 6,001,203 A | 12/1999 | Yamada |
| 6,011,609 A | 1/2000 | Kato |
| 6,016,178 A | 1/2000 | Kataoka |
| 6,016,181 A | 1/2000 | Shimada |
| 6,055,035 A | 4/2000 | Von Gutfeld |
| 6,124,693 A * | 9/2000 | Okanda et al. ........ 318/568.11 |
| 6,163,357 A | 12/2000 | Nakamura |
| 6,190,997 B1 | 2/2001 | Becker et al. |
| 6,219,126 B1 | 4/2001 | Von Gutfeld |
| 6,226,067 B1 | 5/2001 | Nishiguchi |
| 6,236,445 B1 | 5/2001 | Foschaar |
| 6,304,306 B1 | 10/2001 | Shiomi |
| 6,304,311 B1 | 10/2001 | Egami |
| 6,333,636 B1 | 12/2001 | Kim |
| 6,337,730 B1 | 1/2002 | Ozaki |
| 6,414,733 B1 | 7/2002 | Ishikawa |
| 6,437,296 B1 | 8/2002 | Choi |
| 6,442,818 B1 | 9/2002 | Kay et al. |
| 6,530,157 B1 | 3/2003 | Henderson et al. |
| 6,680,775 B1 | 1/2004 | Hirakawa |
| 6,754,971 B1 | 6/2004 | Hagenmeyer et al. |
| 6,811,131 B2 | 11/2004 | Kuo |
| 6,879,370 B2 | 4/2005 | Yokoue et al. |
| 6,885,437 B2 | 4/2005 | Nishi et al. |
| 7,084,961 B2 | 8/2006 | Van De Ven et al. |
| 7,240,438 B2 * | 7/2007 | Lim et al. .................... 33/645 |
| 7,252,492 B2 * | 8/2007 | Olsson et al. ............... 425/143 |
| 2003/0128328 A1 * | 7/2003 | Yokoue et al. ............. 349/187 |
| 2003/0189415 A1 * | 10/2003 | Fitzgibbon ................. 318/466 |
| 2003/0227605 A1 * | 12/2003 | del Puerto et al. ........... 355/51 |
| 2004/0005212 A1 * | 1/2004 | Wu ............................. 414/757 |
| 2004/0124801 A1 * | 7/2004 | Jurado et al. ............... 318/476 |
| 2004/0223132 A1 * | 11/2004 | Nishi et al. ................... 355/75 |
| 2006/0049040 A1 * | 3/2006 | Tepman ................. 204/298.02 |

FOREIGN PATENT DOCUMENTS

| | | |
|---|---|---|
| JP | 51-65056 | 6/1976 |
| JP | 57-038414 | 3/1982 |
| JP | 57-088428 | 6/1982 |
| JP | 58-027126 | 2/1983 |
| JP | 59-057221 | 4/1984 |
| JP | 59-195222 | 11/1984 |
| JP | 60-111221 | 6/1985 |
| JP | 60-164723 | 8/1985 |
| JP | 60-217343 | 10/1985 |
| JP | 61-007822 | 1/1986 |
| JP | 61-055625 | 3/1986 |
| JP | S62-054225 | 3/1987 |
| JP | S62-054228 | 3/1987 |
| JP | S62-054229 | 3/1987 |
| JP | 62-089025 | 4/1987 |
| JP | 62-090622 | 4/1987 |
| JP | 62-205319 | 9/1987 |
| JP | 63-109413 | 5/1988 |
| JP | 63-110425 | 5/1988 |
| JP | 63-128315 | 5/1988 |
| JP | 63-311233 | 12/1988 |
| JP | 01177976 A | 7/1989 |
| JP | H03-009549 | 1/1991 |
| JP | H05-036425 | 2/1993 |
| JP | H05-036426 | 2/1993 |
| JP | H05-107533 | 4/1993 |
| JP | 05-127179 | 5/1993 |
| JP | 05-154923 | 6/1993 |
| JP | 05-265011 | 10/1993 |
| JP | 05-281557 | 10/1993 |
| JP | 05-281562 | 10/1993 |
| JP | H06-018829 | 1/1994 |
| JP | 06-051256 | 2/1994 |
| JP | H06-064229 | 3/1994 |
| JP | 06-148657 | 5/1994 |
| JP | 06-160871 | 6/1994 |
| JP | H06-194637 | 7/1994 |
| JP | 06-235925 | 8/1994 |
| JP | 06-265915 | 9/1994 |
| JP | 06-313870 | 11/1994 |
| JP | 07-084268 | 3/1995 |
| JP | 07-128674 | 5/1995 |
| JP | 07-181507 | 7/1995 |
| JP | H07-275770 | 10/1995 |
| JP | H07-275771 | 10/1995 |
| JP | H08-076133 | 3/1996 |
| JP | 08-095066 | 4/1996 |
| JP | 08-101395 | 4/1996 |
| JP | 08-106101 | 4/1996 |
| JP | H08-110504 | 4/1996 |
| JP | H08-136937 | 5/1996 |
| JP | 08-171094 | 7/1996 |
| JP | 08-190099 | 7/1996 |
| JP | H08-173874 | 7/1996 |
| JP | 08-240807 | 9/1996 |
| JP | 09-005762 | 1/1997 |
| JP | 09-026578 | 1/1997 |
| JP | H09-001026 | 1/1997 |
| JP | 09-311340 | 2/1997 |
| JP | 09-61829 | 3/1997 |
| JP | 09-073075 | 3/1997 |
| JP | 09-073096 | 3/1997 |
| JP | H09-094500 | 4/1997 |
| JP | 09-127528 | 5/1997 |
| JP | 09-230357 | 9/1997 |
| JP | 09-281511 | 10/1997 |
| JP | 10-123537 | 5/1998 |
| JP | 10-123538 | 5/1998 |
| JP | 10-142616 | 5/1998 |
| JP | 10-177178 | 6/1998 |
| JP | H10-174924 | 6/1998 |
| JP | 10-221700 | 8/1998 |
| JP | 10-282512 | 10/1998 |
| JP | 10-333157 | 12/1998 |
| JP | 10-333159 | 12/1998 |
| JP | 11-014953 | 1/1999 |
| JP | 11-038424 | 2/1999 |
| JP | 11-064811 | 3/1999 |
| JP | 11-109388 | 4/1999 |
| JP | 11-133438 | 5/1999 |
| JP | 11-142864 | 5/1999 |
| JP | 11-174477 | 7/1999 |
| JP | 11-212045 | 8/1999 |
| JP | 11-248930 | 9/1999 |
| JP | H11-262712 | 9/1999 |
| JP | H11-264991 | 9/1999 |
| JP | 11-326922 | 11/1999 |
| JP | 11-344714 | 12/1999 |
| JP | 2000-002879 | 1/2000 |
| JP | 2000-029035 | 1/2000 |
| JP | 2000-056311 | 2/2000 |
| JP | 2000-066165 | 3/2000 |
| JP | 2000-066218 | 3/2000 |

| | | | | | |
|---|---|---|---|---|---|
| JP | 2000-093866 | 4/2000 | JP | 2002-014360 | 1/2002 |
| JP | 2000-137235 | 5/2000 | JP | 2002-023176 | 1/2002 |
| JP | 2000-147528 | 5/2000 | JP | 2002-049045 | 2/2002 |
| JP | 2000-193988 | 7/2000 | JP | 2002-079160 | 3/2002 |
| JP | 2000206538 A | 7/2000 | JP | 2002-080321 | 3/2002 |
| JP | 2000-241824 | 9/2000 | JP | 2002-082340 | 3/2002 |
| JP | 2000-284295 | 10/2000 | JP | 2002-090759 | 3/2002 |
| JP | 2000-292799 | 10/2000 | JP | 2002-090760 | 3/2002 |
| JP | 2000-310759 | 11/2000 | JP | 2002-107740 | 4/2002 |
| JP | 2000-310784 | 11/2000 | JP | 2002-122870 | 4/2002 |
| JP | 2000-338501 | 12/2000 | JP | 2002-122872 | 4/2002 |
| JP | 2001-005401 | 1/2001 | JP | 2002-122873 | 4/2002 |
| JP | 2001-005405 | 1/2001 | JP | 2002-131762 | 5/2002 |
| JP | 2001-013506 | 1/2001 | JP | 2002-139734 | 5/2002 |
| JP | 2001-033793 | 2/2001 | JP | 2002-156518 | 5/2002 |
| JP | 2001-042341 | 2/2001 | JP | 2002-169166 | 6/2002 |
| JP | 2001-051284 | 2/2001 | JP | 2002-169167 | 6/2002 |
| JP | 2001-066615 | 3/2001 | JP | 2002-182222 | 6/2002 |
| JP | 2001-091727 | 4/2001 | JP | 2002-202512 | 7/2002 |
| JP | 2001-117105 | 4/2001 | JP | 2002-202514 | 7/2002 |
| JP | 2001-117109 | 4/2001 | JP | 2002-214626 | 7/2002 |
| JP | 2001-133745 | 5/2001 | JP | 2002-229042 | 8/2002 |
| JP | 2001-133794 | 5/2001 | JP | 2002-236276 | 8/2002 |
| JP | 2001-133799 | 5/2001 | JP | 2002-258299 | 8/2002 |
| JP | 2001-142074 | 5/2001 | JP | 2002-236292 | 9/2002 |
| JP | 2001-147437 | 5/2001 | JP | 2002-277865 | 9/2002 |
| JP | 2001-154211 | 6/2001 | JP | 2002-277866 | 9/2002 |
| JP | 2001-166272 | 6/2001 | JP | 2002-277881 | 9/2002 |
| JP | 2001-166310 | 6/2001 | JP | 2002-287156 | 10/2002 |
| JP | 2001-183683 | 7/2001 | JP | 2002-296605 | 10/2002 |
| JP | 2001-201750 | 7/2001 | JP | 2002-311438 | 10/2002 |
| JP | 2001-209052 | 8/2001 | JP | 2002-311440 | 10/2002 |
| JP | 2001-209056 | 8/2001 | JP | 2002-311442 | 10/2002 |
| JP | 2001-209057 | 8/2001 | JP | 2002-323687 | 11/2002 |
| JP | 2001-209058 | 8/2001 | JP | 2002-323694 | 11/2002 |
| JP | 2001-209060 | 8/2001 | JP | 2002-333628 | 11/2002 |
| JP | 2001-215459 | 8/2001 | JP | 2002-333635 | 11/2002 |
| JP | 2001-222017 | 8/2001 | JP | 2002-333843 | 11/2002 |
| JP | 2001-235758 | 8/2001 | JP | 2002-341329 | 11/2002 |
| JP | 2001-255542 | 9/2001 | JP | 2002-341355 | 11/2002 |
| JP | 2001-264782 | 9/2001 | JP | 2002-341356 | 11/2002 |
| JP | 2001-272640 | 10/2001 | JP | 2002-341357 | 11/2002 |
| JP | 2001-281675 | 10/2001 | JP | 2002-341358 | 11/2002 |
| JP | 2001-281678 | 10/2001 | JP | 2002-341359 | 11/2002 |
| JP | 2001-282126 | 10/2001 | JP | 2002-341362 | 11/2002 |
| JP | 2001-305563 | 10/2001 | KR | 2000-0035302 | 6/2000 |
| JP | 2001-330837 | 11/2001 | WO | WO 03017344 A1 * | 2/2003 |
| JP | 2001-330840 | 11/2001 | | | |
| JP | 2001-356353 | 12/2001 | * cited by examiner | | |
| JP | 2001-356354 | 12/2001 | | | |

ALIGNING APPARATUS

This application is a Divisional of Application Ser. No. 11/008,272 filed Dec. 10, 2004 now U.S. Pat. No. 7,240,438, which is hereby incorporated by reference as if fully set forth herein.

The present invention claims the benefit of Korean Patent Application No. 2003-89853 filed in Korea on Dec. 10, 2003, which is hereby incorporated by reference.

BACKGROUND OF THE INVENTION

1. Field of the Invention

The present invention relates to an aligning apparatus, and more particularly, to an aligning apparatus for aligning an alignment object to the aligning apparatus.

2. Discussion of the Related Art

In general, a factory for fabricating display devices utilizes automatic individual processes to attain mass production, improve workability, and cut down production expenses. The automatic processes automatically transfer and align products by employing an automated system, such as a conveyor belt and a robot, to perform the corresponding processes and load the process-completed products, thereby minimizing manual operations. As a result, products can be mass-produced by a small number of monitoring workers.

An aligning apparatus for aligning a product in a target position is required to fabricate products according to the automated processes. A related art aligning apparatus will now be explained with reference to FIGS. 1 and 2. FIG. 1 is a diagram illustrating the related art aligning apparatus. FIG. 2 is a diagram illustrating an alignment object, a first alignment bar and a second alignment bar are damaged due to collision of the alignment object with the first and second alignment bars, when the alignment object is abnormally loaded.

Referring to FIG. 1, the related art aligning apparatus includes a loading plate 10 on which an alignment object 20 is loaded, and first and second alignment bars 30 and 40 for aligning the alignment object 20 loaded on the loading plate 10. Herein, the first and second alignment bars 30 and 40 are driven in close and open directions in which the alignment bars respectively move toward and away from each other, for transferring and aligning the alignment object 20 loaded on the loading plate 10 to a target position. As illustrated in FIG. 2, in the related art aligning apparatus, the driving distance of the first and second alignment bars 30 and 40 is preset according to a size of the alignment object 20. In the event that the alignment object 20 is abnormally loaded on the loading plate 10, that is, for example, a size S1 of the abnormally-loaded alignment object 20 is greater than an isolation distance D1 when the first and second alignment bars 30 and 40 are most close to each other, the alignment object 20 or the first and second alignment bars 30 and 40 are damaged due to collision of the alignment object 20 with the first and second alignment bars 30 and 40. In addition, when a defective object having a larger size than the normal alignment object 20 is loaded, the defective object or the first and second alignment bars 30 and 40 are damaged due to collision of the defective object with the first and second alignment bars 30 and 40.

As described above, in the related art aligning apparatus, when the abnormally-loaded alignment object 20 or the defective object is damaged, the operators must stop an operation of a production line and remove damaged pieces, which results in low productivity. Moreover, when the first and second alignment bars 30 and 40 are damaged, the operators must stop an operation of a production line, remove damaged pieces, and perform a process for separating the first and second alignment bars 30 and 40 from the aligning apparatus, and coupling new alignment bars. As a result, productivity is reduced, and maintenance and repair costs for the aligning apparatus are increased.

SUMMARY OF THE INVENTION

Accordingly, the present invention is directed to an aligning apparatus that substantially obviates one or more of the problems due to limitations an disadvantages of the related art.

An object of the present invention is to provide an aligning apparatus to prevent damage to an alignment object and the apparatus itself, when the alignment object is abnormally loaded to the aligning apparatus or a defective object is loaded onto the aligning apparatus.

Another object of the present invention is to provide an aligning apparatus to prevent damage to a liquid crystal display panel and the apparatus itself, when the liquid crystal display panel is abnormally loaded or a defective object is loaded.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the aligning apparatus includes a loading plate to load at least one alignment object, first and second alignment bars to align the at least one alignment object loaded on the loading plate, wherein the first and second alignment bars are bent by a force greater than a threshold value when contacting the alignment object, and at least one driving unit to drive the first and second alignment bars in close and open directions toward and away from each other.

In another aspect, the aligning apparatus includes a loading plate to load at least one alignment object, first and second alignment bars to align the at least one alignment object on the loading plate, at least one driving unit to drive the first and second alignment bars in close and open directions toward and away from each other, and an elastic unit coupled to at least one of the first and second alignment bars, wherein the elastic unit is bent by a force greater than a threshold value when the first and second alignment bars contact the at least one alignment object.

In another aspect, the aligning apparatus includes a loading plate to load at least one alignment object, first and second alignment bars to align the alignment object loaded on the loading plate, at least one motor to drive the first and second alignment bars in close and open directions toward and away from each other, and a control unit to control the at least one motor so that the first and second alignment bars is able to be transferred in target directions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
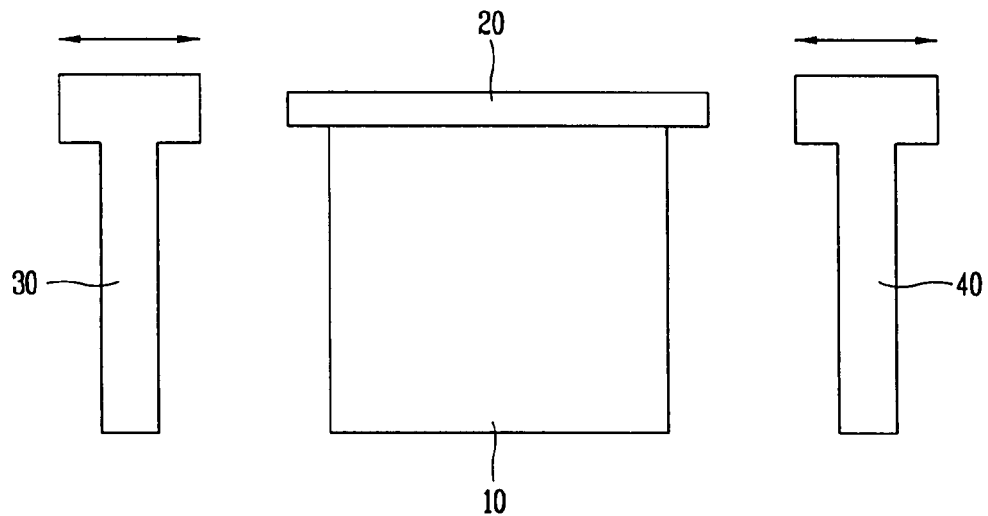
FIG. 1 is a diagram illustrating a related art aligning apparatus.
Figure 2:
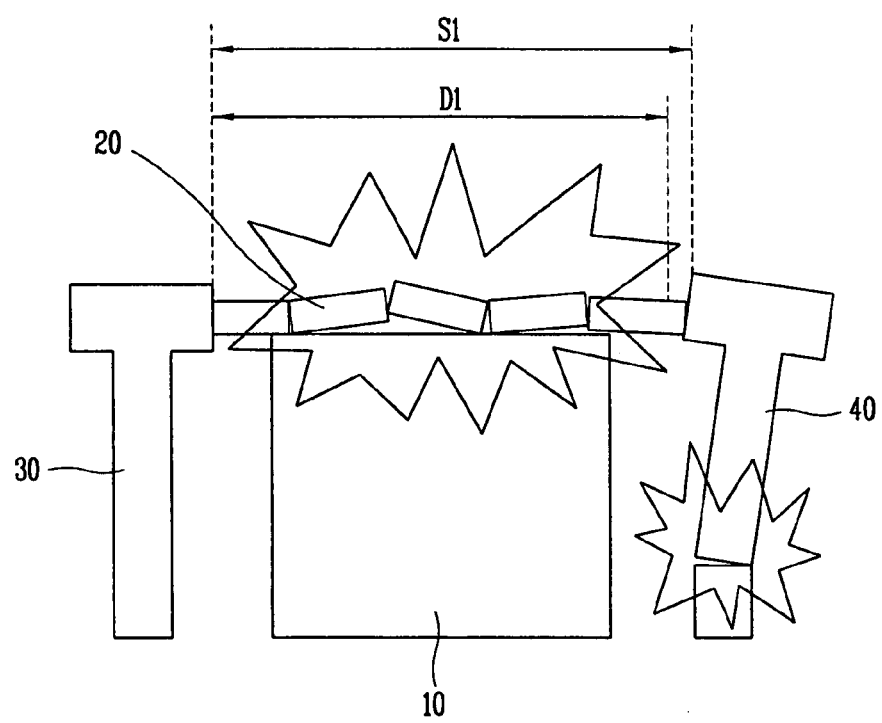
FIG. 2 is a diagram illustrating the related art aligning apparatus of FIG. 1, wherein an alignment object, a first alignment bar and a second alignment bar are damaged due to collision of the alignment object with the first and second alignment bars, when the alignment object is abnormally loaded.
Figure 3:
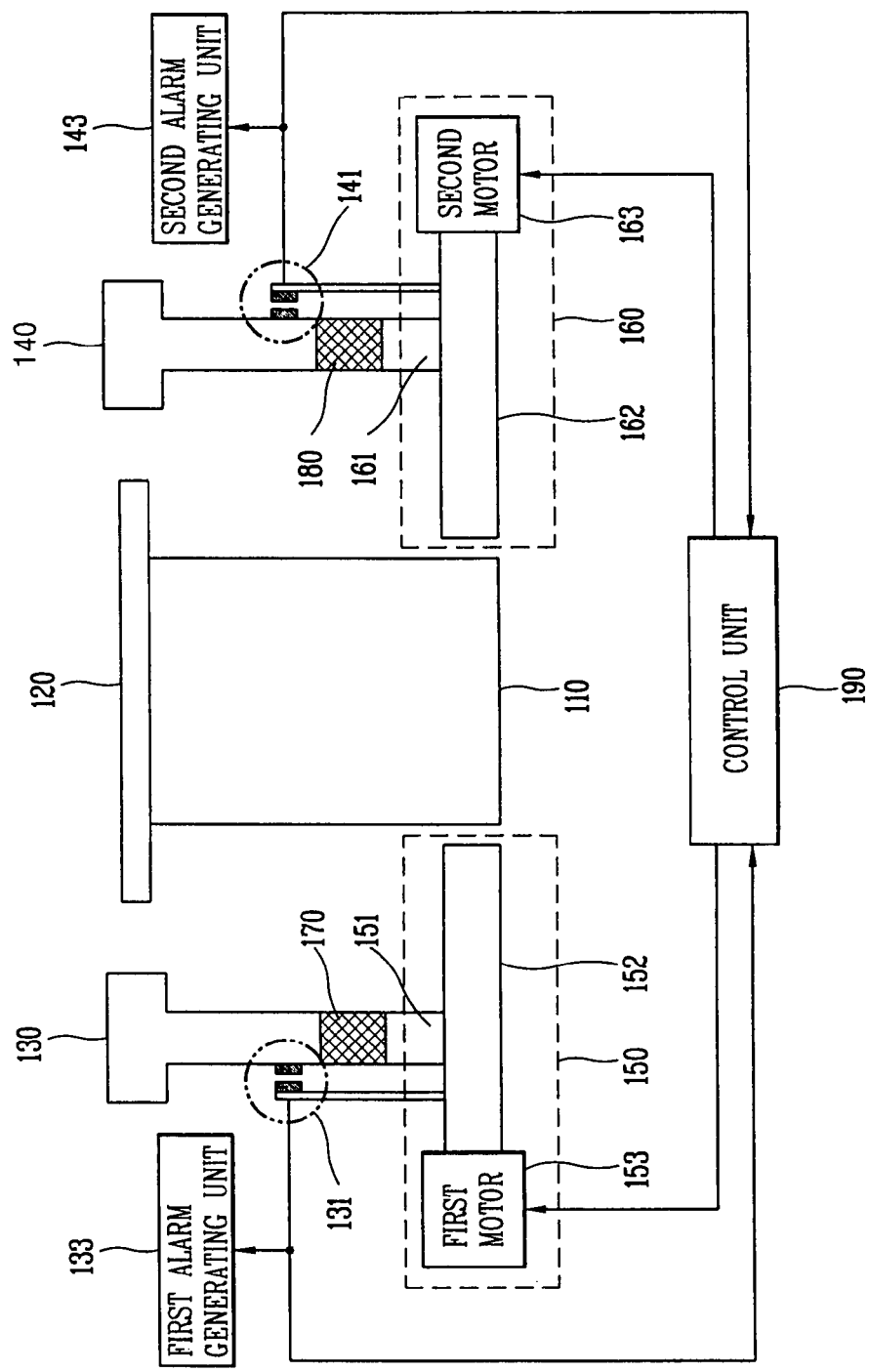
FIG. 3 is a diagram illustrating an aligning apparatus in accordance with an exemplary embodiment of the present invention.
Figure 4:
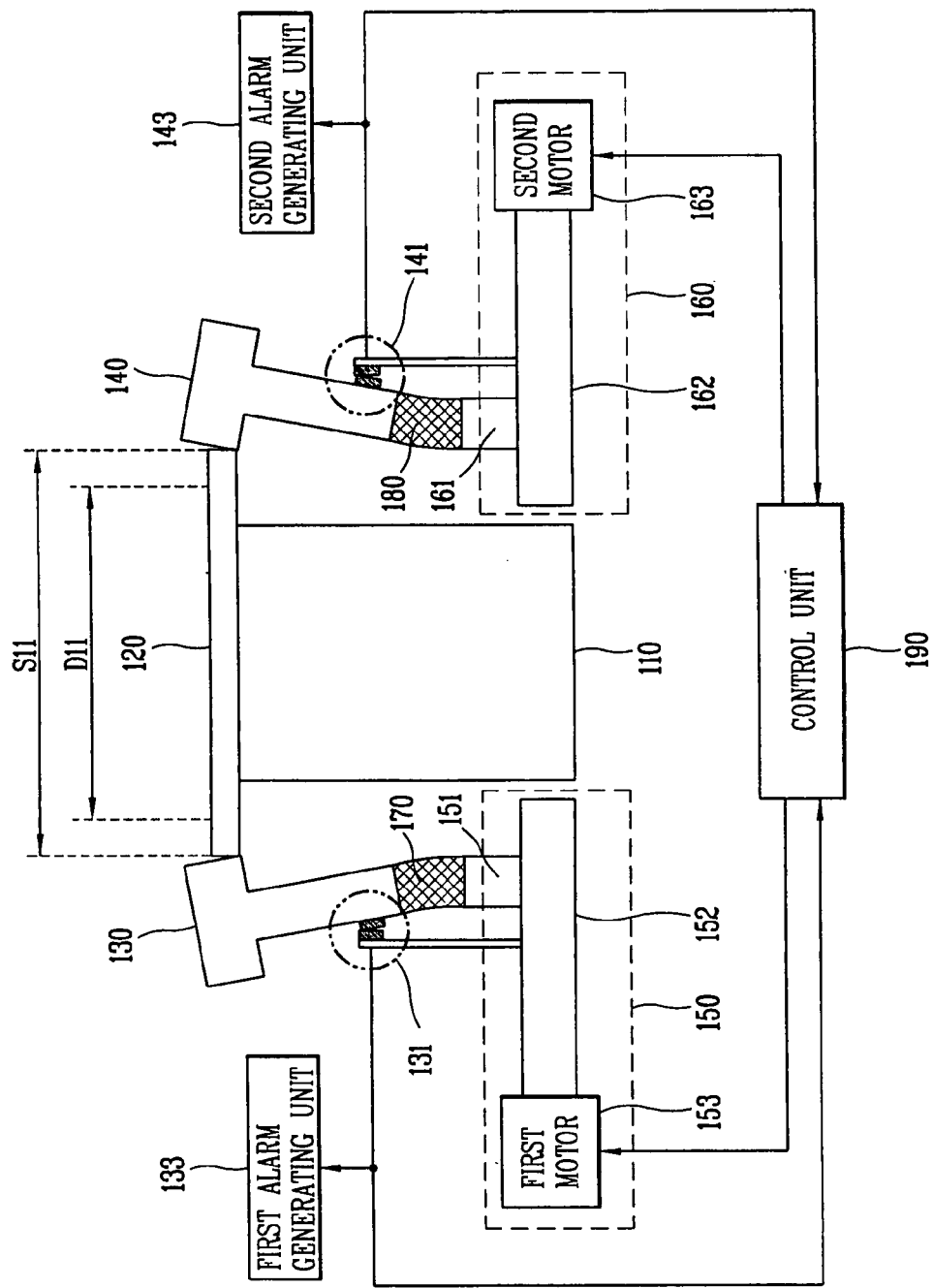
FIG. 4 is a diagram illustrating the aligning apparatus of FIG. 3, wherein an alignment object and first and second alignment bars are protected by buffering a collision of the alignment object and the first and second alignment bars, when the alignment object is abnormally loaded.

FIG. 3 is a diagram illustrating an aligning apparatus in accordance with an exemplary embodiment of the present invention. FIG. 4 is a diagram illustrating the aligning apparatus of FIG. 3, wherein an alignment object and first and second alignment bars are protected by buffering a collision of the alignment object with the first and second alignment bars, when the alignment object is abnormally loaded.

Referring to FIG. 3, the aligning apparatus of this exemplary embodiment includes a loading plate 110 on which an alignment object 120 is loaded, first and second alignment bars 130 and 140 for aligning the alignment object 120 loaded on the loading plate 110, first and second driving units 150 and 160 for driving the first and second alignment bars 130 and 140 in close and open directions in which the alignment bars respectively move toward and away from each other, and first and second elastic units 170 and 180 disposed between the first and second alignment bars 130 and 140 and the first and second driving units 150 and 160, and bent when the first and second alignment bars 130 and 140 receive a force greater than a threshold value.

In accordance with this exemplary embodiment, the first and second alignment bars 130 and 140 are driven in the close and open directions in which the alignment bars respectively move toward and away from each other by the first and second driving units 150 and 160, for transferring and aligning the alignment object 120 loaded on the loading plate 110 at a target position. A driving distance of the first and second alignment bars 130 and 140 is preset according to a size of the alignment object 120. On the other hand, the first and second driving units 150 and 160 include first and second support members 151 and 161 coupled to the first and second alignment bars 130 and 140 through the first and second elastic units 170 and 180, and first and second motors 153 and 163 for driving the first and second support members 151 and 161 in closed and distant directions to and from each other through first and second guide shafts 152 and 162.

As an alternative to the first and second motors 153 and 163, one motor may be installed to drive the first and second support members 151 and 161 in the close and open directions toward and away from each other through the first and second guide shafts 152 and 162. This one motor simultaneously drives the first and second support members 151 and 161 in the close and open directions toward and away from each other through the first and second guide shafts 152 and 162.

The first and second elastic units 170 and 180 are disposed between the first and second support members 151 and 161 and the first and second alignment bars 130 and 140, and bent by a force greater than the threshold value when the first and second alignment bars 130 and 140 are driven in the close direction to each other. As an alternative to the first and second elastic units 170 and 180, one elastic unit may be installed between the first support member 151 and the first alignment bar 130 or between the second support member 161 and the second alignment bar 140. When the first and second alignment bars 130 and 140 are driven in the close direction to each other, this one elastic unit is bent by the force greater than the threshold value.

In accordance with the exemplary embodiment of the present invention, as shown in FIG. 4, in the event that the alignment object 120 is abnormally loaded, that is, for example, a size S11 of the abnormally-loaded alignment object 120 is greater than an isolation distance D1 when the first and second alignment bars 130 and 140 are driven by the first and second driving units 150 and 160 to be close with each other, the first and second elastic units 170 and 180 disposed between the first and second driving units 150 and 160 and the first and second alignment bars 130 and 140 are bent to buffer collision of the abnormally-loaded alignment object 120 with the first and second alignment bars 130 and 140. Accordingly, this exemplary arrangement of the present invention is thus able to prevent the alignment object 120 and the first and second alignment bars 130 and 140 from being damaged.

Similarly, when a defective object having a larger size than the normal alignment object 120 is loaded, the first and second elastic units 170 and 180 disposed between the first and second driving units 150 and 160 and the first and second alignment bars 130 and 140 are bent to buffer the collision of the defective object with the first and second alignment bars 130 and 140. Thus, damage to the defective object and/or the first and second alignment bars 130 and 140 is prevented.

Referring back to FIG. 3, the aligning apparatus of this exemplary embodiment further includes first and second contact-type sensors 131 and 141 disposed on the sidewalls of the first and second alignment bars 130 and 140 and a control unit 190. The first and second contact-type sensors 131 and 141 contact when the first and second alignment bars 130 and 140 are inclined by the bent first and second elastic units 170 and 180. The control unit 190 stops driving of the first and second alignment bars 130 and 140 and drives the first and second alignment bars 130 and 140 in the open direction away from each other by controlling the first and second driving units 150 and 160, when the first and second contact-type sensors 131 and 141 contact. As an alternative to the first and second contact-type sensors 131 and 141, one contact-type sensor may be disposed on the sidewall of the first alignment bar 130 or the second alignment bar 140 to make contact when the first and second alignment bars 130 and 140 are inclined by the bent first and second elastic units 170 and 180.

As described above, when the first and second contact-type sensors 131 and 141 contact, the control unit 190 stops driving the first and second alignment bars 130 and 140 in the close direction toward each other and then drives the first and second alignment bars 130 and 140 in the open direction away from each other, by controlling the first and second driving units 150 and 160. Therefore, when the alignment object 120 is abnormally loaded or the defective object having a larger size than the normal alignment object 120 is loaded, the abnormally-loaded alignment object 120, the defective object, and the first and second alignment bars 130 and 140 are not damaged, and an operation of a production line can be safely stopped.

In addition, the aligning apparatus of this exemplary embodiment further includes first and second alarm generating units 133 and 143 installed to generate an alarm when the first and second contact-type sensors 131 and 141 contact. Herein, the first and second alarm generating units 133 and 143 may be connected directly to the first and second contact-type sensors 131 and 141 to generate the alarm when the first and second contact-type sensors 131 and 141 contact, or may be connected to the control unit 190 to generate the alarm according to the signal from the control unit 190. Accordingly, when the alignment object 120 is abnormally loaded or the defective object having a larger size than the normal alignment object 120 is loaded, once the first and second alarm generating units 133 and 143 generate the alarm, the operators can promptly resolve any errors.

Figure 5A:
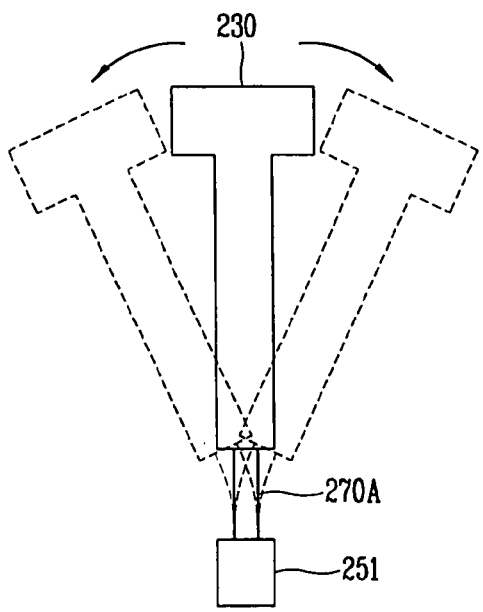
FIGS. 5a to 5d are exemplary diagrams illustrating various examples of first and second elastic units of the aligning apparatus of FIG. 3.

The preferred examples of the elastic units in the aligning apparatus in accordance with the present invention will now be explained with reference to FIGS. 5A to 5D. FIGS. 5A to 5D are exemplary diagrams illustrating various examples of the first and second elastic units 170 and 180. As illustrated in FIG. 5A, a first example of the elastic unit includes a support member 251 and an alignment bar 230 coupled by an elastomer 270A. When the support member 251 is driven in one side direction, the alignment bar 230 coupled to the support member 251 by the elastomer 270A transfers an alignment object (120 in FIG. 4) in one side direction. When a force of transferring the alignment object is applied to the alignment bar 230, the elastomer 270A is not bent. However, when the alignment object is abnormally loaded or the defective object having a larger size than the normal alignment object is loaded, a force over a threshold value is applied to the alignment bar 230 to bend the elastomer 270A in the opposite direction to the driving direction of the support member 251, thereby preventing damages to the alignment object and the alignment bar 230.

Figure 5B:
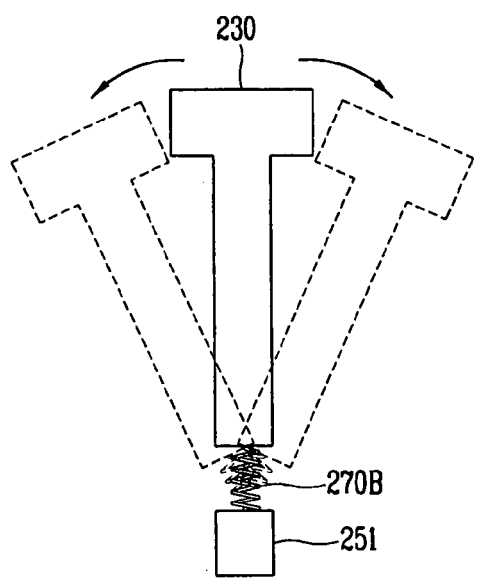

As illustrated in FIG. 5B, a second example of the elastic unit includes a support member 251 and an alignment bar 230 coupled by a spring 270B. In this arrangement, when the support member 251 is driven in one side direction, the alignment bar 230 coupled to the support member 251 by the spring 270B transfers the alignment object (120 in FIG. 4) in one side direction. When a force of transferring the alignment object is applied to the alignment bar 230, the spring 270B is not bent. However, when the alignment object is abnormally loaded or the defective object having a larger size than the normal alignment object is loaded, a force over a threshold value is applied to the alignment bar 230 to bend the spring 270B in the opposite direction to the driving direction of the support member 251, thereby preventing damage to the alignment object or the alignment bar 230.

Figure 5C:
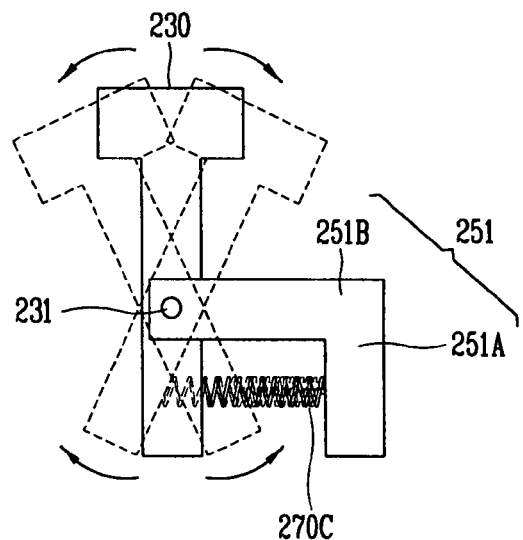

Referring to FIG. 5C, in a third example of the elastic unit, an end of a horizontal shaft 251B of a support member 251 formed in a reverse "L" shape is coupled to an alignment bar 230 by a connection pin 231, and a vertical shaft 251A of the support member 251 is coupled to a lower portion of the alignment bar 230 by a spring 270C. When the support member 251 is driven in one side direction, the alignment bar 230 coupled to the support member 251 by the connection pin 231 and the spring 270C transfers the alignment object (120 in FIG. 4) in one side direction. When a force of transferring the alignment object is applied to the alignment bar 230, the spring 270C supports the vertical shaft 251A of the support member 251 and the lower portion of the alignment bar 230 so that they are not separated. However, when the alignment object is abnormally loaded or the defective object having a larger size than the normal alignment object is loaded, a force over a threshold value is applied to the alignment bar 230 to extend the spring 270C so that an upper portion of the alignment bar 230 can be inclined in the opposite direction to the driving direction of the support member 251, thereby preventing damage to the alignment object or the alignment bar 230.

Figure 5D:
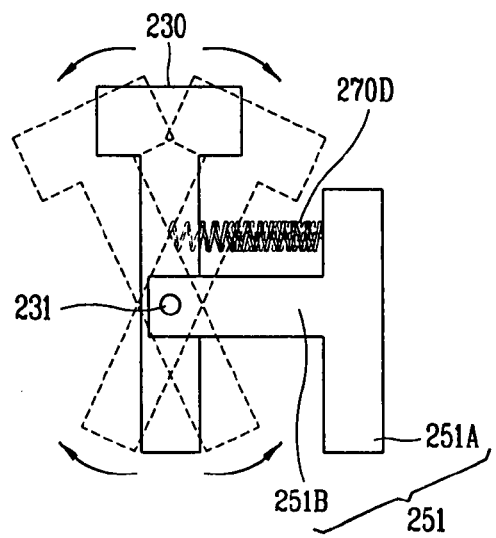

As illustrated in FIG. 5D, in a fourth example of the elastic unit, an end of a horizontal shaft 251B of a support member 251 formed in a 'T' shape is coupled to an alignment bar 230 by a connection pin 231, and a vertical shaft 251A of the support member 251 is coupled to an upper portion of the alignment bar 230 by a spring 270D. When the support member 251 is driven in one side direction, the alignment bar 230 coupled to the support member 251 by the connection pin 231 and the spring 270D transfers the alignment object (120 in FIG. 4) in one side direction. When a force of transferring the alignment object is applied to the alignment bar 230, the spring 270D supports the vertical shaft 251A and the upper portion of the alignment bar 230 so that they do not approach each other. However, when the alignment object is abnormally loaded or a defective object having a larger size than the normal alignment object is loaded, a force over a threshold value is applied to the alignment bar 230 to contract the spring 270D so that the upper portion of the alignment bar 230 can incline in the opposite direction to the driving direction of the support member 251, thereby preventing damage to the alignment object or the alignment bar 230.

Figure 6:
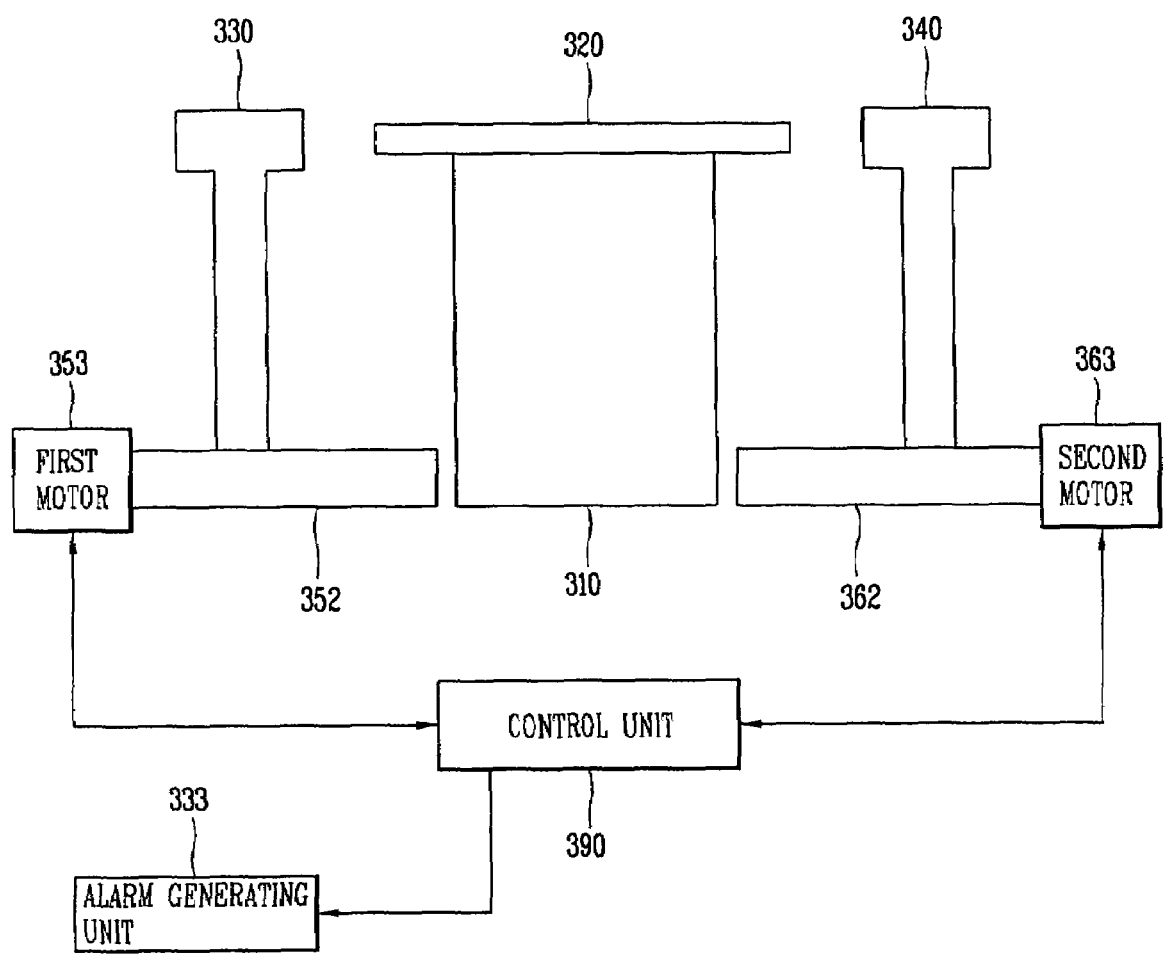
FIG. 6 is an exemplary diagram illustrating an aligning apparatus in accordance with another exemplary embodiment of the present invention.

An aligning apparatus in accordance with another exemplary embodiment of the present invention will now be described with reference to FIG. 6. FIG. 6 is a diagram illustrating the aligning apparatus in accordance with this exemplary embodiment.

As illustrated in FIG. 6, the aligning apparatus in accordance with this exemplary embodiment includes a loading plate 310 on which an alignment object 320 is loaded, first and second alignment bars 330 and 340 for aligning the alignment object 320 loaded on the loading plate 310, first and second motors 353 and 363 for driving the first and second alignment bars 330 and 340 in close and open directions toward and away from each other through first and second guide shafts 352 and 362, and a control unit 390 for measuring load of the first and second motors 353 and 363. When the load is greater than a threshold value, the control unit 390 stops driving of the first and second alignment bars 330 and 340 in the close direction toward each other and then drives the first and second alignment bars 330 and 340 in the open direction away from each other by controlling the first and second motors 353 and 363.

In accordance with this exemplary embodiment, the control unit 390 controls driving of the first and second motors 353 and 363, so that the first and second alignment bars 330 and 340 can be driven in the close and open directions toward and away from each other through the first and second guide shafts 352 and 362, for transferring and aligning the alignment object 320 loaded on the loading plate 310 in a target position. As an alternative to the first and second motors 353 and 363 of FIG. 6, one motor may be installed to drive the first and second alignment bars 330 and 340 in the close and open directions through the first and second guide shafts 352 and 362. This one motor simultaneously drives the first and second alignment bars 330 and 340 in the close and open directions to and from each other through the first and second guide shafts 352 and 362. A driving distance of the first and second alignment bars 330 and 340 driven in the close and open directions by the first and second motors 353 and 363 is preset according to a size of the alignment object 320.

In accordance with this exemplary embodiment, in the event that the alignment object 320 is abnormally loaded, that is, for example, a size of the abnormally-loaded alignment object 320 is greater than an isolation distance when the first and second alignment bars 330 and 340 are driven by the first and second motors 353 and 363 to be close to each other, the load of the first and second motors 353 and 363 is measured by the control unit 390. When the load is greater than a threshold value, the control unit 390 stops driving the first and second alignment bars 330 and 340 in the close direction to each other and then drives the first and second alignment bars 330 and 340 in the open direction from each other by reversing the first and second motors 353 and 363, thereby preventing damage to the abnormally-loaded alignment object 320 or the first and second alignment bars 330 and 340. The operation of the production line can also be stopped.

Similarly, when a defective object having a larger size than the normal alignment object 320 is loaded, the load of the first and second motors 353 and 363 is greater than the threshold value. Therefore, the control unit 390 measures the load of the first and second motors 353 and 363. When the load is greater than the threshold value, the control unit 390 stops driving the first and second alignment bars 330 and 340 in the close direction toward each other and then drives the first and second alignment bars 330 and 340 in the open direction away from each other by controlling the first and second motors 353 and 363, thereby preventing damages to the abnormally-loaded alignment object 320 or the first and second alignment bars 330 and 340. The operation of the production line can also be stopped.

Referring back to FIG. 6, the aligning apparatus further includes an alarm generating unit 333 for receiving a control signal from the control unit 390 and generating an alarm, when the load of the first and second motors 353 and 363 is greater than the threshold value. When the alignment object 320 is abnormally loaded or the defective object having a larger size than the normal alignment object 320 is loaded, the alarm generating unit 333 generates the alarm and the operators can promptly resolve any errors.

The aligning apparatuses in accordance with the exemplary embodiments of the present invention may be applied to an automation factory manufacturing various products according to automated processes. For example, when a fragile substrate used for fabrication of a flat panel display device is automatically transferred and aligned by an automated system such as a conveyor belt and a robot, and various processes are performed thereon, even if the substrate is abnormally loaded or a defective object having a larger size than the normal substrate is loaded, the substrate or the alignment bars are not damaged.

Figure 7:
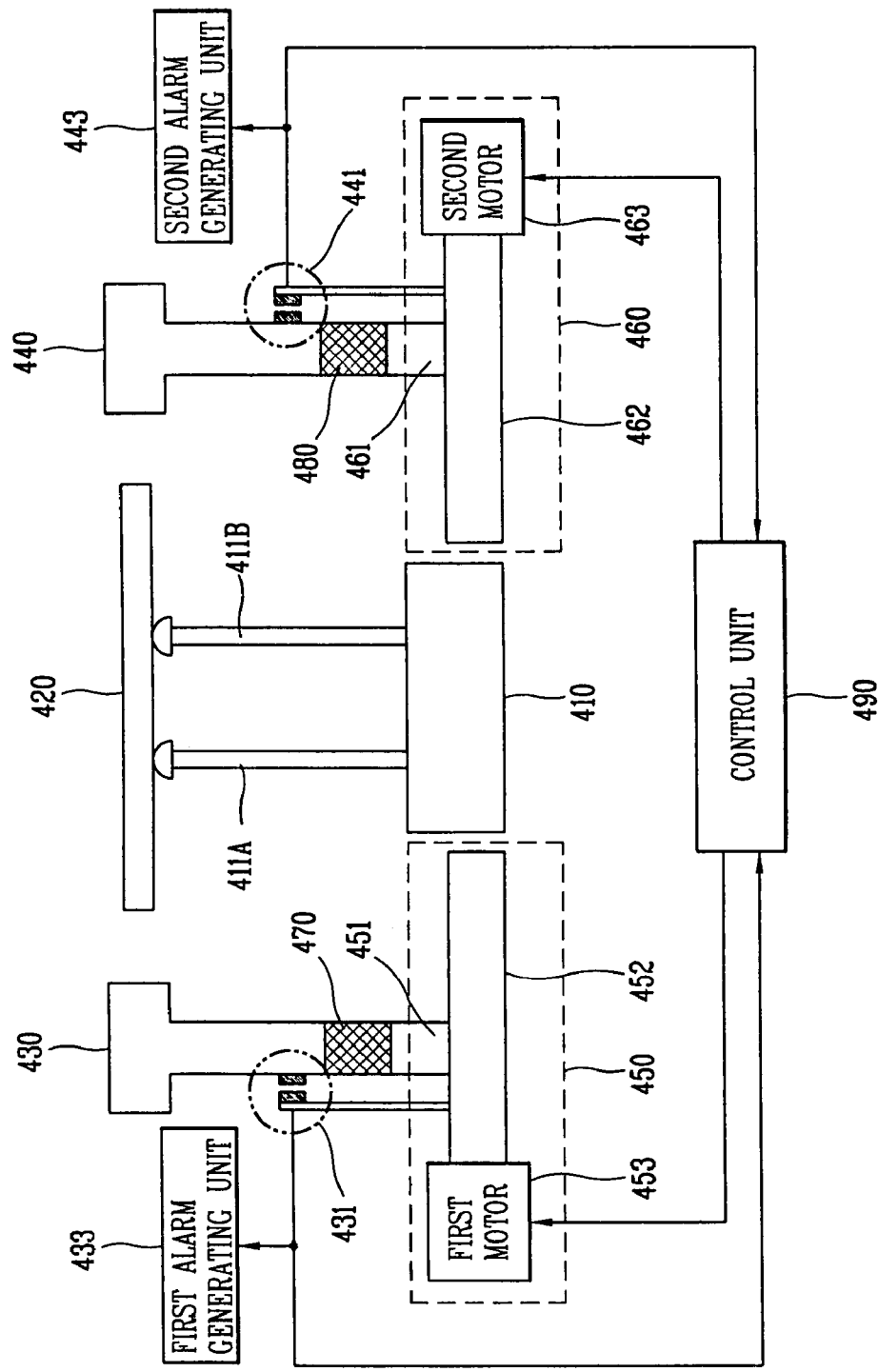
FIG. 7 is an exemplary diagram illustrating application of the aligning apparatus of FIG. 3 to fabrication of a substrate for a flat panel display device.

FIG. 7 is an exemplary diagram illustrating application of the aligning apparatus of the exemplary embodiment of the present invention to production of the substrate for a flat panel display device.

Referring to FIG. 7, the aligning apparatus includes a loading plate 410 on which a substrate 420 is loaded, first and second support pins 411A and 411B protruded from the surface of the loading plate 410 for supporting the substrate 420, first and second alignment bars 430 and 440 for aligning the substrate 420 supported by the first and second support pins 411A and 411B, first and second driving units 450 and 460 for driving the first and second alignment bars 430 and 440 in close and open directions that are toward and away from each other, and first and second elastic units 470 and 480 disposed between the first and second alignment bars 430 and 440 and the first and second driving units 450 and 460, and bent when the first and second alignment bars 430 and 440 receive a force greater than a threshold value. Herein, the substrate 420 may be applied to fabrication of the flat panel display device such as an electro-luminescence display (ELD), a plasma display panel (PDP), a field emission display (FED), a liquid crystal display (LCD), or the like.

The LCD device displays images by controlling light transmittance of pixels arranged in a matrix shape by supplying data signals based on image information to the pixels, respectively. The LCD usually includes an LCD panel on which pixels are arranged in a matrix shape, and a driving circuit for driving the pixels. The LCD panel includes a thin film transistor array substrate and a color filter substrate attached to face each other with a regular cell-gap, and a liquid crystal material formed in the gap between the color filter substrate and the thin film transistor array substrate.

The thin film transistor array substrate and the color filter substrate are attached by seal patterns formed along edges of an image display unit. Herein, a spacer may be formed on the thin film transistor array substrate or the color filter substrate for maintaining the cell-gap between the attached thin film transistor array substrate and color filter substrate. A polarizing plate and a phase shift plate are disposed on the outer surfaces of the thin film transistor array substrate and the color filter substrate. The LCD is provided with high luminance and contrast properties by changing light proceeding or refraction by selectively using the aforementioned components. Common electrodes and pixel electrodes are formed on the LCD panel formed on the thin film transistor array substrate and the color filter substrate to face each other, for applying an electric field to the liquid crystal material. That is, in a state where a controlled voltage is applied across the common electrodes and individual pixel electrodes light transmittance of the unit pixels can be individually adjusted. In order to control the voltage applied to the pixel electrodes in each unit pixel, thin film transistors serving as switching elements are formed on the unit pixels, respectively. Oriented films are formed on the facing surfaces of the thin film transistor array substrate and the color filter substrate and rubbed, so that liquid crystals of the liquid crystal layer can be arranged in a predetermined direction.

In the fabrication of the LCD devices, a plurality of LCD panels are formed simultaneously by forming a plurality of thin film transistor array substrates on a first large-sized mother board, forming a plurality of color filter substrates on a second large-sized mother board, and soldering, cutting and processing the first and second mother boards, which results in a high yield.

When the aligning apparatus of the exemplary embodiment is applied to fabrication of the substrate of the LCD, the first mother board on which the plurality of thin film transistor array substrates have been formed, the second mother board on which the plurality of color filter substrates have been formed, the attached first and second mother boards, or the LCD panel cut and processed from the attached first and second mother boards may be used as the substrate 420 supported by the first and second support pins 411A and 411B. Herein, three, four or more support pins may be installed to stably support the substrate 420.

As described above, when the aligning apparatus of the exemplary embodiment is applied to fabrication of the substrate of the flat panel display device, the first and second alignment bars 430 and 440 are driven in the close and open directions by the first and second driving units 450 and 460, for transferring and aligning the substrate 420 supported by the first and second support pins 411A and 411B in a target position. On the other hand, after the first and second support pins 411A and 411B supporting the substrate 420 are lowered to load the substrate 420 on the loading plate 410, the first and second alignment bars 430 and 440 may be driven in the close and open directions by the first and second driving units 450 and 460, for transferring and aligning the substrate 420 loaded on the loading plate 410 in a target position. A driving distance of the first and second alignment bars 430 and 440 driven in the close and open directions by the first and second driving units 450 and 460 is preset according to a size of the substrate 420.

The first and second driving units 450 and 460 include first and second support members 451 and 461 coupled to the first and second alignment bars 430 and 440 through the first and second elastic units 470 and 480, and first and second motors 453 and 463 for driving the first and second support members 451 and 461 in close and open directions through first and second guide shafts 452 and 462. As an alternative to the first and second motors 453 and 463 of FIG. 7, one motor may be installed to drive the first and second support members 451 and 461 in the close and open directions through the first and second guide shafts 452 and 462. This one motor simultaneously drives the first and second support members 451 and 461 in the close and open directions through the first and second guide shafts 452 and 462.

The first and second elastic units 470 and 480 are disposed between the first and second support members 451 and 461 of the first and second driving units 450 and 460 and the first and second alignment bars 430 and 440, and bent by a force greater than a threshold value when the first and second alignment bars 430 and 440 are driven in the close direction to each other. As an alternative to the first and second elastic units 470 and 480 of FIG. 7, one elastic unit may be installed between the first support member 451 of the first driving unit 450 and the first alignment bar 430 or between the second support member 461 of the second driving unit 460 and the second alignment bar 440. This one elastic unit is bent by a force greater than a threshold value when the first and second alignment bars 430 and 440 are driven in the close direction to each other.

Accordingly, when the aligning apparatus of the first embodiment is applied to fabrication of the flat panel display device, if the substrate 420 is abnormally loaded, that is, for example, a size of the abnormally-loaded substrate 420 is greater than an isolation distance when the first and second alignment bars 430 and 440 are driven by the first and second driving units 450 and 460 to be closest to each other, the first and second elastic units 470 and 480 disposed between the first and second driving units 450 and 460 and the first and second alignment bars 430 and 440 are bent to buffer a collision of the abnormally-loaded substrate 420 with the first and second alignment bars 430 and 440. As a result, the substrate 420 and/or the first and second alignment bars 430 and 440 are not damaged.

Similarly, when a defective object having a larger size than the normal substrate 420 is loaded, the first and second elastic units 470 and 480 disposed between the first and second driving units 450 and 460 and the first and second alignment bars 430 and 440 are bent for buffering a collision of the defective object with the first and second alignment bars 430 and 440. Thus, the defective object and/or the first and second alignment bars 430 and 440 are not damaged.

Herein, the LCD panel cut and processed from the attached first and second mother boards of the LCD may be one example of the defective object having a larger size than the normal substrate 420. Burrs may remain due to defective cutting on the cross sections of the LCD panel. The LCD panel having the burrs on its cross sections may be larger than the normal LCD panel. When LCD panel is aligned by the first and second alignment bars 430 and 440, the first and second alignment bars 430 and 440 receive a greater force than the threshold value, and thus the first and second elastic units 470 and 480 are bent. On the other hand, as shown in FIG. 7, the aligning apparatus further includes first and second contact-type sensors 431 and 441 disposed on the sidewalls of the first and second alignment bars 430 and 440, and a control unit 490. The first and second contact-type sensors 431 and 441 contact when the first and second alignment bars 430 and 440 are inclined by the bent first and second elastic units 470 and 480. The control unit 490 is additionally installed to stop driving the first and second alignment bars 430 and 440 in the close direction to each other and to drive the first and second alignment bars 430 and 440 in the distant direction from each other by controlling the first and second driving units 450 and 460, when the first and second contact-type sensors 431 and 441 contact.

As described above, when the first and second contact-type sensors 431 and 441 contact, the control unit 490 stops driving the first and second alignment bars 430 and 440 in the close direction to each other and then drives the first and second alignment bars 430 and 440 in the distant direction from each other, by controlling the first and second driving units 450 and 460. Therefore, when the substrate 420 is abnormally loaded or the defective object having a larger size than the normal substrate 420 is loaded, the abnormally-loaded substrate 420, the defective object, and/or the first and second alignment bars 430 and 440 are not damaged, and an operation of a production line can be safely stopped.

In addition, the aligning apparatus further includes first and second alarm generating units 433 and 443 installed to generate an alarm when the first and second contact-type sensors 431 and 441 contact. Herein, the first and second alarm generating units 433 and 443 are connected directly to the first and second contact-type sensors 431 and 441 to generate the alarm when the first and second contact-type sensors 431 and 441 contact, or connected to the control unit 490 to generate the alarm according to the signal from the control unit 490. Accordingly, when the substrate 420 is abnormally loaded or the defective object having a larger size than the normal substrate 420 is loaded, if the first and second alarm generating units 433 and 443 generate the alarm, the operators can promptly take necessary actions. The various examples shown in FIGS. 5A through 5D may be used as the first and second elastic units 470 and 480.

Since application of the aligning apparatus of the exemplary embodiment to fabrication of the substrate of the flat panel display device has been described in detail with reference to FIG. 7, although not explained, application of the aligning apparatus of the other exemplary embodiment to fabrication of the substrate of the flat panel display device is easily understood by those skilled in the art to which the present invention pertains.

As discussed earlier, in accordance with the exemplary embodiment of the present invention, when the alignment object is abnormally loaded or the defective object having a larger size than the normal alignment object is loaded, the elastic units are bent to incline the alignment bars, thereby preventing damage to the abnormally-loaded alignment object, the defective object, and the first and second alignment bars. In addition, the alarm is generated to notify any error to the operators In accordance with the other exemplary embodiment of the present invention, the load of the motors driving the alignment bars is measured. When the alignment object is abnormally loaded or the defective object having a larger size than the normal alignment object is loaded and the load of the motors is greater than the threshold value, the alignment bars are stopped and driven to the initial positions, thereby preventing damages to the abnormally-loaded alignment object, the defective object, and/or the first and second alignment bars. Also, the alarm is generated to notify any error to the operators.

As a result, in accordance with the exemplary embodiments of the present invention, productivity is improved by omitting the process for removing damaged pieces and the process for separating the damaged alignment bars from the aligning apparatus and coupling new alignment bars, which are performed when the alignment object or the alignment bars are damaged. Furthermore, it is possible to decrease the maintenance and repair costs for the aligning apparatus due to damage and replacement of the components It will be apparent to those skilled in the art that various modifications and variations can be made in the aligning apparatus of the present invention without departing from the spirit or scope of the invention. Thus, it is intended that the present invention cover the modifications and variations of this invention provided they come within the scope of the appended claims and their equivalents.

What is claimed is:

1. An aligning apparatus, comprising:
a loading plate to load at least one alignment object;
first and second alignment bars to align the alignment object loaded on the loading plate;
at least one motor to drive the first and second alignment bars in close and open directions toward and away from each other;
a control unit to control the at least one motor so that the first and second alignment bars is able to be transferred in target directions, wherein the control unit measures load of the at least one motor, and causes the at least one motor to drive the first and second alignment bars in the open direction away from each other when the load is greater than a threshold value; and
an alarm generating unit to receive a control signal from the control unit and generate an alarm, when the load of the at least one motor is greater than a threshold value.

2. The aligning apparatus of claim 1, wherein the alignment object is a substrate of a flat panel display device.

3. The aligning apparatus of claim 1, wherein the alignment object is a substrate of a liquid crystal display device.

4. The aligning apparatus of claim 3, wherein the substrate of the liquid crystal display is any one of a first mother board having a plurality of thin film transistor array substrates, a second mother board having a plurality of color filter substrates, a substrate formed by attaching the first and second mother boards, and a liquid crystal display panel formed by cutting attached first and second mother boards.

5. The aligning apparatus of claim 1, further comprising a plurality of support pins protruded from a surface of the loading plate to support the at least one alignment object.

6. The aligning apparatus of claim 2, wherein the flat panel display device is one of an electro-luminescence display, a plasma display panel, a field emission display and a liquid crystal display device.

* * * * *